US006589836B1

(12) United States Patent
Wang et al.

(10) Patent No.: US 6,589,836 B1
(45) Date of Patent: Jul. 8, 2003

(54) ONE STEP DUAL SALICIDE FORMATION FOR ULTRA SHALLOW JUNCTION APPLICATIONS

(75) Inventors: Mei-Yun Wang, Hsin-Chu (TW); Chih-Wei Chang, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/263,896

(22) Filed: Oct. 3, 2002

(51) Int. Cl.[7] .......................................... H01L 21/8238
(52) U.S. Cl. ....................... 438/231; 438/532; 438/592; 438/664
(58) Field of Search ................................. 438/231, 232, 438/407, 528, 532, 592, 655, 656, 659, 664

(56) References Cited

U.S. PATENT DOCUMENTS

| 5,034,348 | A | * | 7/1991 | Hartswick et al. | 438/664 |
| 6,072,222 | A | * | 6/2000 | Nistler | 438/659 |
| 6,150,243 | A | * | 11/2000 | Wieczorek et al. | 438/655 |
| 6,255,214 | B1 | * | 7/2001 | Wieczorek et al. | 438/664 |
| 6,323,077 | B1 | * | 11/2001 | Guo | 438/231 |
| 6,451,679 | B1 | * | 9/2002 | Hu et al. | 438/592 |
| 6,465,295 | B1 | * | 10/2002 | Kitamura | 438/231 |
| 2001/0006832 | A1 | * | 7/2001 | Bae et al. | 438/231 |

* cited by examiner

Primary Examiner—Chandra Chaudhari
(74) Attorney, Agent, or Firm—George O. Saile; Stephen B. Ackerman

(57) ABSTRACT

A process for formation of metal silicide on elements of an NMOS device and on elements of a PMOS device, wherein the metal silicide formed on elements of the PMOS device is thinner than the metal silicide simultaneously formed on elements of said NMOS device, has been developed. The process features the implantation of metal ions such as titanium, tantalum, vanadium, or rhenium, during the implantation procedure used for formation of the heavily doped P type source/drain region of the PMOS device. The presence of the implanted metal ions in PMOS regions retard the formation of metal silicide resulting in a thinner metal silicide layer on the heavily doped P type source/drain region, when compared to the thicker metal silicide counterparts simultaneously formed on elements of the NMOS device. The thinner metal silicide for the PMOS device reduces the risk of junction leakage at the heavily doped P type source/drain—N well interface, while the thicker metal silicide layer located on elements of the NMOS device, allow lower word line resistance to be realized.

30 Claims, 4 Drawing Sheets

ONE STEP DUAL SALICIDE FORMATION FOR ULTRA SHALLOW JUNCTION APPLICATIONS

BACKGROUND OF THE INVENTION (1) Field of the Invention

The present invention relates to methods used to fabricate semiconductor devices, and more specifically to a method of forming thin salicide (self-aligned metal silicide), on elements of a P channel metal oxide semiconductor (PMOS), device, while simultaneously forming thicker salicide on elements of an N channel metal oxide semiconductor (NMOS), device.

(2) Description of Prior Art

The emergence of micro-miniaturization, or the ability to fabricate semiconductor devices comprised with sub-micron features, have allowed the performance of semiconductor devices to be increased while the processing costs for these same devices have been reduced. Sub-micron features allow performance degrading junction capacitances to be reduced, in addition the greater amount of smaller semiconductor chips realized from a specific size semiconductor wafer, still providing device densities equal to or greater than larger counterpart chips, have allowed the processing costs for a specific semiconductor chip to be reduced. However specific aspects of micro-miniaturization can present fabrication situations which have to be addressed. For example the narrower channel regions now available with micro-miniaturization result in word line widths of 0.20 $\mu$m or less. To avoid low word line resistance, in addition to avoiding metal silicide agglomeration, thick metal silicide regions are formed on the word lines, with the self-aligned metal silicide (salicide), procedure, simultaneously forming metal silicide on exposed source/drain regions. However when employing a salicide procedure for complimentary metal oxide semiconductor (CMOS), devices, the thicker metal silicide desired for the low word line resistance for the NMOS component of the CMOS device, can adversely influence the yield of the PMOS component, when the same metal silicide layer is formed on the PMOS source/drain region. The thicker metal silicide layer can induce junction leakage at the P+/N well interface of the PMOS component.

The present invention will teach a process for simultaneously forming a thick metal silicide layer on elements of an NMOS device, while the same salicide procedure results in a thinner metal silicide layer on the word line and source/drain regions of the PMOS component of a CMOS device. This is accomplished via incorporation of specific elements into the PMOS components prior to the salicide procedure, with the specific elements used to retard metal silicide formation. Prior art, such as Guo, in U.S. Pat. No. 6,323,077 B1, Wieczorek et al, in U.S. Pat. No. 6,150,243, Nistler, in U.S. Pat. No. 6,072,222, and Wieczorek et al, in U.S. Pat. No. 6,255,214, describe methods of forming metal silicide layers on regions of a semiconductor device. None of the above prior art however describe the novel process sequence employed in the present invention wherein a single salicide procedure is used to form a metal silicide layer on components of a PMOS device, thinner than the metal silicide layer simultaneously formed on elements of an NMOS device.

SUMMARY OF THE INVENTION

It is an object of this invention to simultaneously form metal silicide on the word line and source/drain regions of both NMOS and PMOS devices.

It is another object of this invention to simultaneously form metal silicide on both PMOS and NMOS regions, with the metal silicide on PMOS elements thinner than the metal silicide formed on the NMOS elements.

It is still another object of this invention to implant specific elements such as titanium (Ti), tantalum (Ta), vanadium (V), and rhenium (Re), during the PMOS source/drain implantation procedure, with these specific elements retarding the subsequent salicide formation on PMOS elements, allowing a thinner metal silicide to be formed on the PMOS elements when compared to metal silicide simultaneously formed on counterpart NMOS elements.

In accordance with the present invention a method of forming thinner metal silicide on elements of a PMOS device, while simultaneously forming thicker metal silicide on elements of a NMOS device, is described. After formation of an N well region in an area of a semiconductor substrate to be used for PMOS device fabrication, a gate insulator layer and gate structures, comprised with insulator sidewall spacers, are defined on areas of the semiconductor substrate to be used for both PMOS and for NMOS fabrication. After formation of a heavily doped source/drain region in the NMOS region, a photoresist blockout shape is to allow P type ions, as well as specific metal ions, to be implanted only into regions of the PMOS device to be used as subsequent heavily doped source/drain regions. Deposition of a metal layer is followed by an anneal procedure resulting in metal silicide formation on exposed silicon and polysilicon regions of both PMOS and NMOS elements. The presence of the specific metal ions in the PMOS word line and source/drain region retarded the formation of metal silicide in these regions resulting in a thinner metal silicide layer in PMOS regions than the thicker, or non-retarded metal silicide simultaneously formed in NMOS regions. Regions of unreacted metal, located on the insulator sidewall spacers, are selectively removed.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
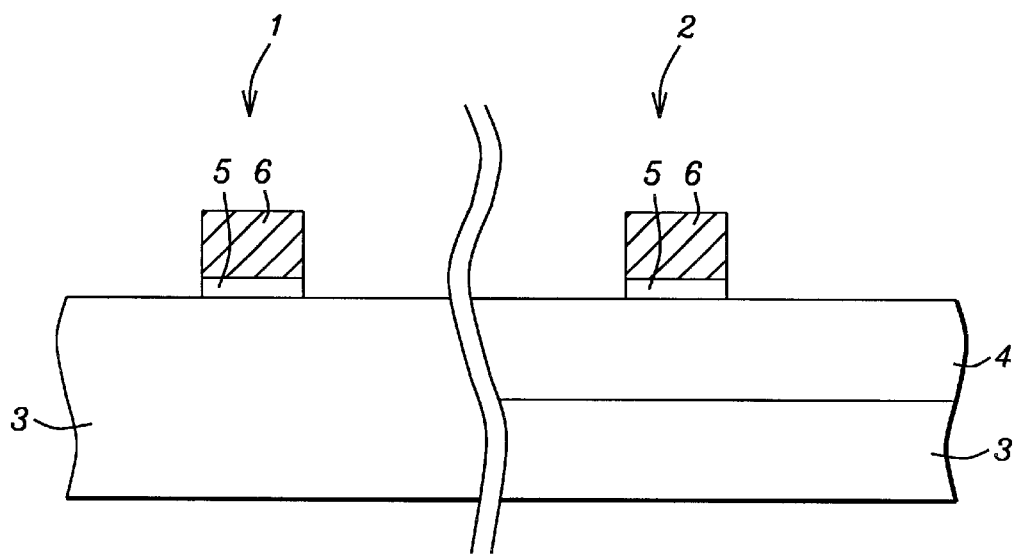
FIGS. 1–7, which schematically, in cross-sectional style, describe key stages of fabrication used to simultaneously form salicide on both PMOS and NMOS elements of a CMOS device, wherein the thickness of the metal silicide on the PMOS elements is thinner than the metal silicide simultaneously formed on the NMOS elements.

The method of forming a metal silicide layer on components of a CMOS device, in which the thickness of the metal silicide layer formed on elements of a PMOS device is thinner than the metal silicide layer simultaneously formed on elements of an NMOS device, will now be described in detail. Semiconductor substrate 3, comprised of P type, single crystalline silicon, featuring a <100> crystallographic orientation, is used and schematically shown in FIG. 1. Region 1, of semiconductor substrate 3, will be used to accommodate the NMOS device, while region 2, of semiconductor substrate 3, will be used for the PMOS device. To enable fabrication of a PMOS device an N well region has to be formed in a top portion of P type, semiconductor substrate 3. A photoresist shape, not shown in the drawings, is used to block NMOS region 1, from arsenic or phosphorous ions, implanted at an energy between about 1 to 500

KeV, at a dose between about 1E14 to 1E17 atoms/cm$^2$. After removal of the blockout photoresist shape, via plasma oxygen ashing procedures, an anneal procedure is performed to activate the implanted N type ions, resulting in N well region 4, located in a top portion of semiconductor substrate 3, and shown schematically in FIG. 1.

Gate insulator layer 5, comprised of silicon dioxide at a thickness between about 10 to 50 Angstroms, is next thermally grown on the surface of semiconductor substrate 3, at a temperature between about 300 to 1000° C., in an oxygen-steam ambient. A conductive layer such as doped polysilicon is next deposited via low pressure chemical vapor deposition (LPCVD), procedures, to a thickness between about 900 to 3000 Angstroms. The polysilicon layer can be doped in situ during deposition via the addition of arsine or phosphine to a silane or disilane ambient, or the polysilicon layer can be deposited intrinsically than doped via the implantation of arsenic or phosphorous ions. If lower word line resistance is desired the conductive layer can be comprised of a metal silicide layer such as tungsten silicide, or be comprised of a polycide layer featuring metal silicide on underlying polysilicon. A photoresist shape, not shown in the drawings, is next used as an etch mask allowing an anisotropic reactive ion etch (RIE), procedure to define gate structures 6, on gate insulator layer 5, in both NMOS region 1, as well as in PMOS region 2. The RIE procedure is performed using $Cl_2$ or $SF_6$ as a selective etchant for the conductive layer, with the RIE procedure selectively terminating at the appearance of gate insulator layer 5. The narrow width of gate structures 6, which influence the device channel length, is between about 0.03 to 0.20 μm. Removal of the gate structure defining photoresist shape is accomplished via plasma oxygen ashing and wet clean procedures, with a buffered hydrofluoric acid step, used as a component of the wet clean procedure, removing the portions of gate insulator layer 5, not covered by gate structures 6. The result of these procedures is schematically shown in FIG. 1.

Figure 2:
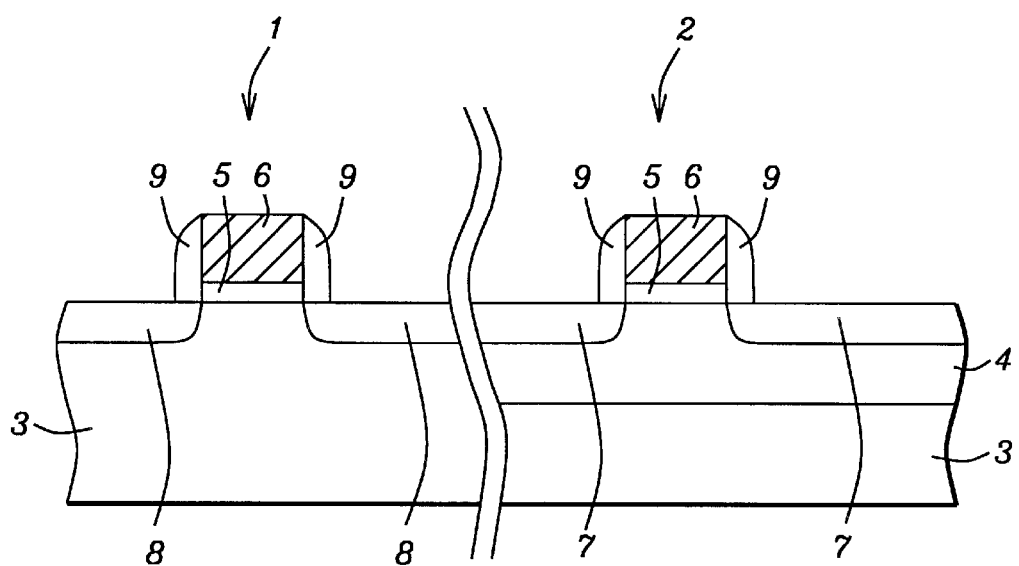

If desired lightly doped source/drain (LDD), regions, can be formed in both NMOS and PMOS regions. A photoresist blockout shape, not shown in the drawings, is used to protect NMOS region 1, from boron or $BF_2$ ions, implanted at an energy between about 1 to 100 KeV, at a dose between about 1E14 to 1E17 atoms/cm$^2$, resulting in the formation of P type LDD region 7, in areas of PMOS region 2, not covered by gate structure 6. After removal of the NMOS photoresist blockout shape, another photoresist blockout shape is used to protect PMOS region 2, from implantation of arsenic or phosphorous ions, implanted at an energy between about 1 to 100 KeV, at a dose between about 1E14 to 1E17 atoms/cm$^2$, resulting in N type LDD region 8, located in areas of NMOS region 1, not covered by gate structure 6. The NMOS photoresist blockout shape is then removed via plasma oxygen ashing procedures. An insulator layer such as silicon oxide, or silicon nitride, is next deposited at a thickness between about 100 to 5000 Angstroms, via LPCVD or via plasma enhanced chemical vapor deposition (PECVD), procedures. An anisotropic RTE procedure, using $CHF_3$ as an etchant for the silicon oxide option, or using $CF_4$ or $Cl_2$ as an etchant for the silicon nitride option, is employed to define insulator spacers 9, on the sides of gate structures 6. The result of these procedures is schematically shown in FIG. 2.

Figure 3:
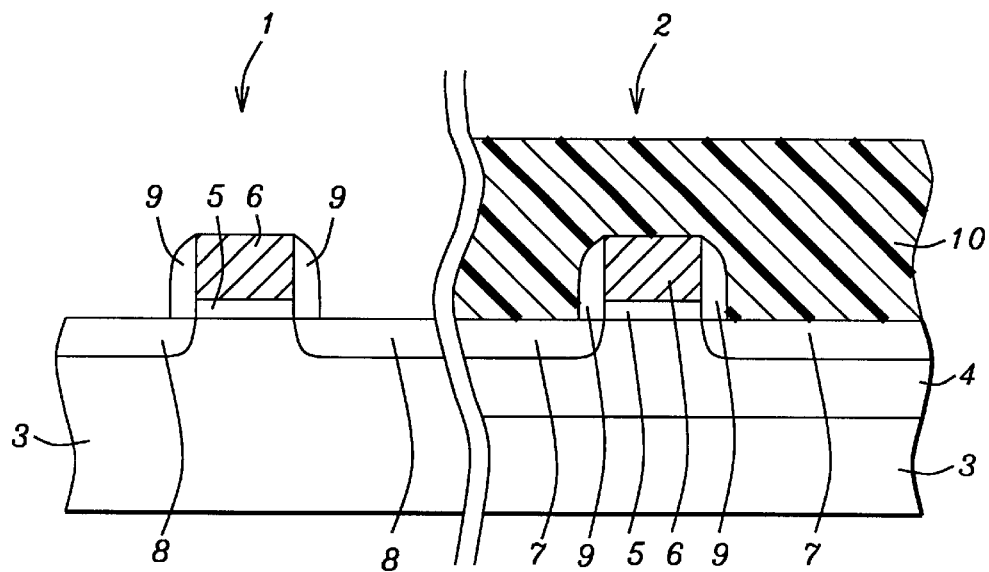

The formation of an N type, heavily doped source/drain region in NMOS region 1, is next addressed and schematically described using FIG. 3. Photoresist shape 10, is used to protect PMOS region 2, during the procedure used to form N type, heavily doped source/drain region 11, in NMOS region 1. This is accomplished via implantation of arsenic or phosphorous ions at an energy between about 1 to 100 KeV, at a dose between about 1E14 to 1E17 atoms/cm$^2$.

Figure 4:
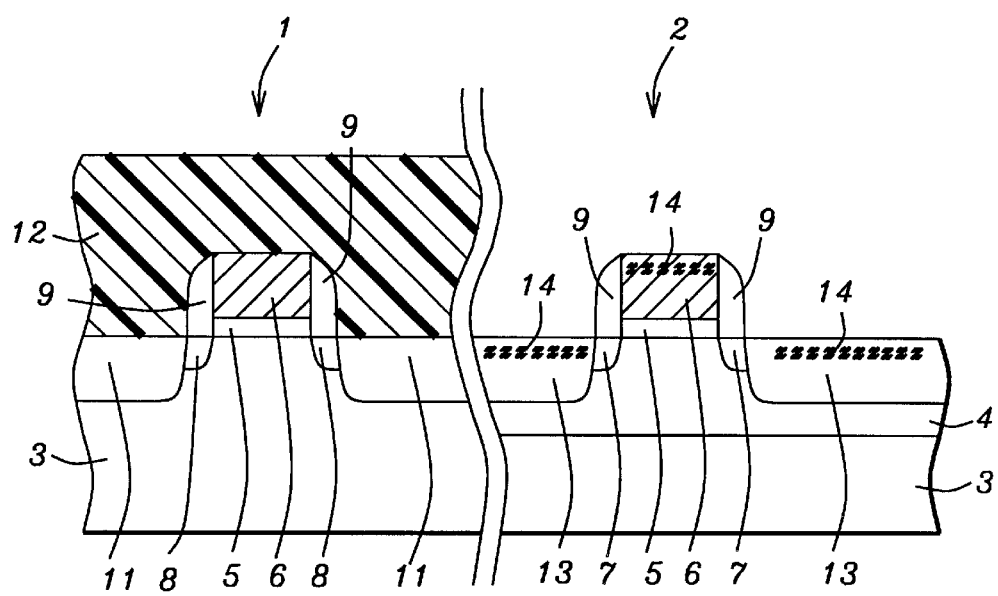

After removal of photoresist shape 10, via plasma oxygen ashing procedures, photoresist shape 12, shown schematically in FIG. 4, is used to protect the NMOS region from the procedure used to form a P type, heavily doped source/drain region in PMOS region 2. However to subsequently form a metal silicide layer on a soon to be defined P type, heavily doped source/drain region, with the metal silicide layer thinner than a simultaneously formed metal silicide layer on N type, heavily doped source/drain region located in NMOS region 1, specific metal ions are included with the P type implanted species, used for the P type source/drain region. These specific metal ions incorporated in the P type source/drain region, will retard the extent of formation of metal silicide on the P type source/drain region, resulting in a metal silicide layer thinner than a simultaneously formed metal silicide layer on the N type source/drain region. Therefore the procedure used to form P type, heavily doped source/drain 13, in PMOS region 2, is performed using P type ions boron, or $BF_2$, at an energy between about 1 to 100 KeV, at a dose between about 1E14 to 1E17 atoms/cm$^2$, however including implantation of specific metal ions, chosen from a group that includes titanium, tantalum, vanadium and rhenium. The specific metal ions are implanted at an energy between about 1 to 100 KeV, at a dose between about 1E14 to 1E17 atoms/cm$^2$. Metal ions 14, are now located in top portions of P type heavily doped source/drain region 13, as well as located in a top portion of gate structure 6, in PMOS region 2. Removal of photoresist shape 12, is again accomplished via plasma oxygen ashing. The result of these procedures is schematically shown in FIG. 4.

Figure 5:
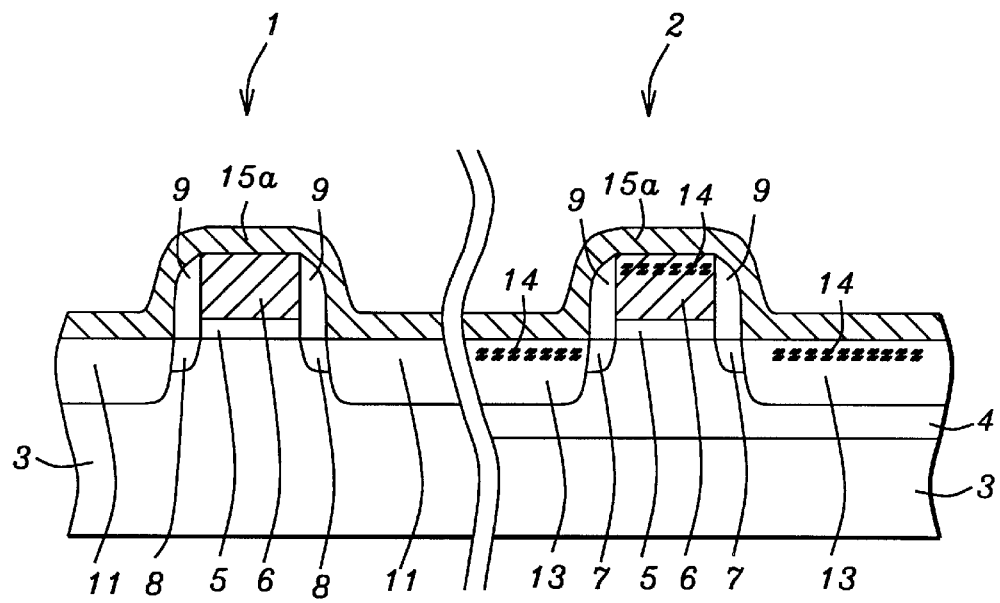
Figure 6:
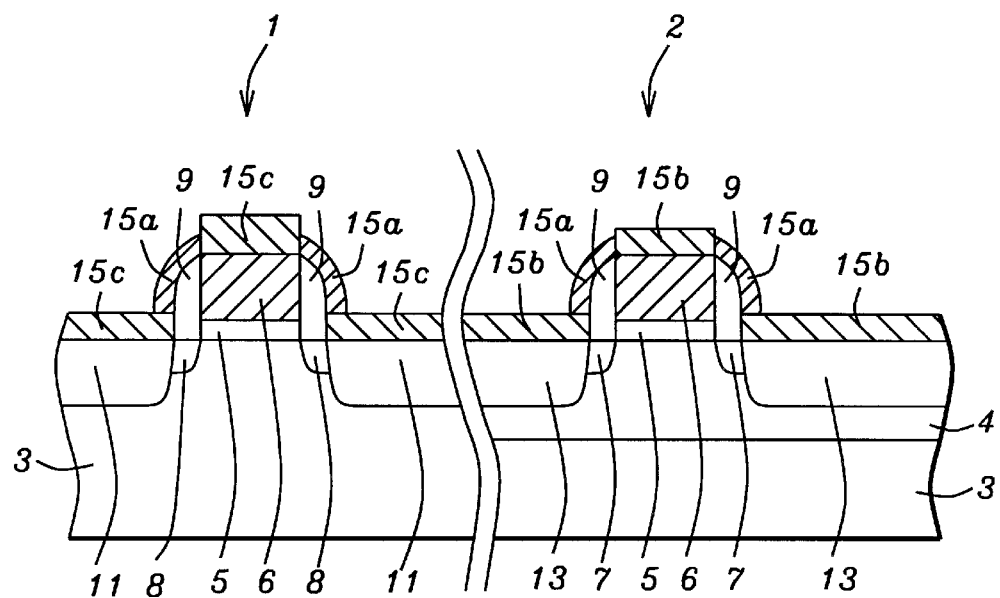

Metal layer 15a, comprised of an element such as cobalt, is next deposited via plasma vapor deposition (PVD), procedures, to a thickness between about 10 to 500 Angstroms. The thickness of metal layer 15a, is the same overlying elements in both NMOS region 1, and PMOS region 2. This is schematically shown in FIG. 5. If desired metal layer 15a, can be comprised of a metal such as titanium, tantalum, tungsten, or nickel. An anneal procedure is next used to form metal silicide on regions in which metal layer 15a, overlaid conductive regions in NMOS region 1, and in PMOS region 2. The anneal procedure can be performed using conventional furnace processing, at a temperature between about 300 to 700° C., for a time between about 1 to 100 min, in an inert ambient, or the procedure can be accomplished via rapid thermal annealing, performed at a temperature between about 300 to 700° C., for a time between about 5 to 300 sec, in an inert ambient. Metal silicide, or cobalt silicide layer 15c, shown schematically in FIG. 6, is formed on N type heavily doped source/drain region 11, as well as on gate structure 6, in NMOS region 1, at a thickness between about 20 to 1500 Angstroms. The robust metal silicide layer 15c, on gate structure 6, will result in a desired low Rs, for the narrow gate structure, allowing the desired NMOS performance to be realized. However the incorporation of specific metal ions 14, in P type heavily doped source/drain region 13, retards metal silicide formation in PMOS region 2, resulting in metal silicide, or cobalt silicide layer 15b, formed simultaneously during the anneal procedure, but only at a thickness between about 10 to 1200 Angstroms. Thinner metal silicide layer 15b, on P type heavily doped source/drain region 13, will decrease the risk of P+/N well junction leakage. Regions of metal layer 15a, residing on insulator spacers 9, remain unreacted. The result of the anneal procedure is illustrated in FIG. 6.

Figure 7:
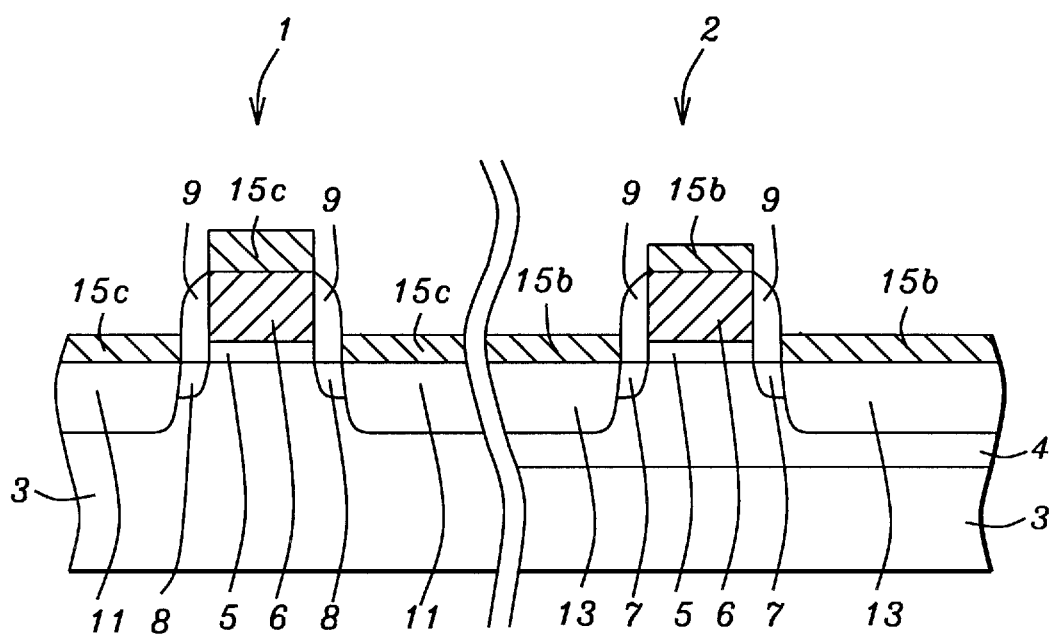

Removal of unreacted metal layer 15a, is next accomplished selectively via wet etch procedures, using a solution comprised with either $H_2O_2/H_2SO_4$, $Hcl/H_2O$, $NH_4OH/H_2O_2/H_2O$, $H_3PO_4$, $CH_3COOH$, or $HNO_3$, performed at a temperature between about 25 to 150° C. Metal silicide layers 15b, and thicker metal silicide layer 15c, are not attacked during the selective removal of unreacted metal layer 15a. This is schematically shown in FIG. 7, wherein metal silicide layer 15b, is formed on elements of PMOS region 2, thinner than counterpart metal silicide layer 15c, simultaneously formed on elements of NMOS region 1.

While this invention has been particularly shown and described with reference to the preferred embodiments thereof, it will be understood by those skilled in the art that various changes in form and details may be made without departing from the spirit and scope of this invention.

What is claimed is:

1. A method of forming metal silicide layers on a semiconductor substrate, comprising the steps of:
    providing a first region of said semiconductor substrate for accommodation of a first type semiconductor device, and providing a second region of said semiconductor substrate for accommodation of a second type semiconductor device;
    forming gate structures with sidewall insulator spacers on an underlying gate insulator layer, wherein said gate insulator layer is located on said semiconductor substrate;
    performing a first ion implantation procedure to form a first conductivity type source/drain region in a portion of said first region of semiconductor substrate;
    performing a second ion implantation procedure to form a second conductivity type source/drain region in a portion of said second region of said semiconductor substrate, and to place metal ions in a top portion of said second conductivity type source/drain region and in a top portion of said gate structure located in said second region of said semiconductor substrate;
    depositing a metal layer;
    performing an anneal procedure to form first metal silicide layers, of a first thickness, on said first conductivity type source/drain region and on a gate structure located in said first region of said semiconductor substrate, while simultaneously forming second metal silicide layers, of a second thickness, on said second conductivity type source/drain region and on a gate structure located in said second region of said semiconductor substrate, while said metal layer located on said sidewall insulator spacers remains unreacted; and
    selectively removing unreacted metal layer from said insulator spacers.

2. The method of claim 1, wherein said first type semiconductor device is an N channel, metal oxide semiconductor, (NMOS), device.

3. The method of claim 1, wherein said second type semiconductor device is a P channel, metal oxide semiconductor, (PMOS), device.

4. The method of claim 1, wherein said gate insulator layer is a silicon dioxide layer at a thickness between about 10 to 50 Angstroms, obtained via thermal oxidation procedures performed at a temperature between about 300 to 1000° C., in an oxygen-steam ambient.

5. The method of claim 1, wherein said gate structures are comprised of doped polysilicon, at a thickness between about 900 to 3000 Angstroms.

6. The method of claim 1, wherein the width of said gate structures is between about 0.03 to 0.20 $\mu$m.

7. The method of claim 1, wherein said insulator spacers are comprised of silicon oxide or silicon nitride, at a thickness between about 100 to 5000 Angstroms.

8. The method of claim 1, wherein said first conductivity type source/drain region is a heavily doped N type source/drain region, obtained via said first ion implantation procedure performed using arsenic or phosphorous ions at an energy between about 1 to 100 KeV, at a dose between about 1E14 to 1E17 atoms/cm$^2$.

9. The method of claim 1, wherein said second conductivity type source/drain region is a heavily doped P type source/drain region, obtained via said second ion implantation procedure performed using boron or $BF_2$ ions at an energy between about 1 to 100 KeV, at a dose between about 1E14 to 1E17 atoms/cm$^2$.

10. The method of claim 1, wherein said metal ions, implanted into a top portion of said second conductivity type source/drain region, during said second ion implantation procedure, are chosen from a group that contains titanium, tantalum, vanadium, and rhenium.

11. The method of claim 1, wherein said metal ions are placed in a top portion of said second conductivity type source/drain region via said second ion implantation procedure, performed at an implant energy between about 1 to 100 KeV, and at a dose between about 1E14 to 1E17 atoms/cm$^2$.

12. The method of claim 1, wherein said metal layer is chosen from a group containing cobalt, tantalum, titanium and nickel, obtained at a thickness between about 10 to 500 Angstroms via plasma vapor deposition procedures.

13. The method of claim 1, wherein said anneal procedure is performed at a temperature between about 300 to 700° C., for a time between about 1 to 100 min, in an inert ambient, using conventional furnace procedures.

14. The method of claim 1, wherein said anneal procedure is performed using rapid thermal annealing, performed at a temperature between about 300 to 700° C., for a time between about 5 to 300 sec, in an inert ambient.

15. The method of claim 1, wherein said first thickness of said first metal silicide layers, is between about 20 to 1500 Angstroms.

16. The method of claim 1, wherein said second thickness of said second metal silicide layers, is between about 10 to 1200 Angstroms.

17. A method of forming metal silicide layers on elements of an NMOS device and on elements of a PMOS device, wherein metal silicide layer formed on elements of said PMOS device is thinner than metal silicide simultaneously formed on elements of said NMOS device, comprising the steps of:
    providing a semiconductor substrate featuring a first region to be used for accommodation of said NMOS device, and featuring second region to be used for accommodation of said PMOS device;
    growing a silicon dioxide gate insulator layer on said semiconductor substrate;
    forming gate structures on underlying, said silicon dioxide gate insulator layer;
    forming insulator spacers on the sides of said gate structures;
    performing a first ion implantation procedure to form a heavily doped N type source/drain region in a portion of said first region of semiconductor substrate;
    performing a second ion implantation procedure to form a heavily doped P type source/drain region in a portion of said second region of said semiconductor substrate, with said second implantation procedure implanting metal ions into a top portion of said heavily doped P type source/drain region and in a top portion of a gate structure located in said PMOS second region of said semiconductor substrate;

depositing a metal layer;

performing an anneal procedure to form first metal silicide layers, featuring a first thickness, on said heavily doped N type source/drain region and on a gate structure located in said first region of said semiconductor substrate, and simultaneously forming second metal silicide layers of a second thickness on said heavily doped P type source/drain and on a gate structure located in said second region of said semiconductor substrate, with said first thickness of said metal silicide layers greater than said second thickness of said second metal silicide layers, and with said metal layer located on said insulator spacers remaining unreacted; and selectively removing unreacted metal layer from said insulator spacers.

18. The method of claim 17, wherein said silicon dioxide gate insulator layer is obtained at a thickness between about 10 to 50 Angstroms, via thermal oxidation procedures performed at a temperature between about 300 to 1000° C., in an oxygen-steam ambient.

19. The method of claim 17, wherein said gate structures are comprised of doped polysilicon, defined at a thickness between about 900 to 3000 Angstroms.

20. The method of claim 17, wherein the width of said gate structures is between about 0.03 to 0.20 $\mu$m.

21. The method of claim 17, wherein said insulator spacers are comprised of silicon oxide or silicon nitride, at a thickness between about 100 to 5000 Angstroms.

22. The method of claim 17, wherein said heavily doped N type source/drain region is obtained via said first ion implantation procedure performed using arsenic or phosphorous ions at an energy between about 1 to 100 KeV, at a dose between about 1E14 to 1E17 atoms/cm$^2$.

23. The method of claim 17, wherein said heavily doped P type source/drain region is obtained via said second ion implantation procedure performed using boron or BF$_2$ ions at an energy between about 1 to 100 KeV, at a dose between about 1E14 to 1E17 atoms/cm$^2$.

24. The method of claim 17, wherein said metal ions, implanted into a top portion of said heavily doped P type source/drain region during said second ion implantation procedure, are chosen from a group that contains titanium, tantalum, vanadium, and rhenium.

25. The method of claim 17, wherein said metal ions are placed in a top portion of said heavily doped P type source/drain region via said second ion implantation procedure, performed at an implant energy between about 1 to 100 KeV, and at a dose between about 1E14 to 1E17 atoms/cm$^2$.

26. The method of claim 17, wherein said metal layer is chosen from a group that contains cobalt, tantalum, titanium, and nickel, obtained at a thickness between about 10 to 500 Angstroms via plasma vapor deposition procedures.

27. The method of claim 17, wherein said anneal procedure is performed at a temperature between about 300 to 700° C., for a time between about 1 to 100 min, in an inert ambient, using conventional furnace procedures.

28. The method of claim 17, wherein said anneal procedure is performed using rapid thermal annealing, performed at a temperature between about 300 to 700° C., for a time between about 5 to 300 sec, in an inert ambient.

29. The method of claim 17, wherein the thickness of said first metal silicide layers, located on said heavily doped N type source/drain region and on a gate structure located in said first region of said semiconductor substrate, is between about 20 to 1500 Angstroms.

30. The method of claim 17, wherein the thickness of said second metal silicide layers, located on said heavily doped P type source/drain region and on a gate structure located in said second region of said semiconductor substrate, is between about 10 to 1200 Angstroms.

* * * * *